United States Patent
Park et al.

(10) Patent No.: US 9,035,297 B2
(45) Date of Patent: May 19, 2015

(54) THIN-FILM TRANSISTOR AND ZINC OXIDE-BASED SPUTTERING TARGET FOR THE SAME

(71) Applicants: SAMSUNG CORNING PRECISION MATERIALS CO., LTD., Gumi-si, Gyeongsangbuk-do (KR); Samsung Display Co., Ltd., Yongin (KR)

(72) Inventors: Jaewoo Park, Yongin (KR); Yoon Gyu Lee, Asan-si (KR); Do-Hyun Kim, Yongin (KR); Dongjo Kim, Asan-si (KR); Juok Park, Asan-si (KR); Insung Sohn, Asan-si (KR); Sangwon Yoon, Asan-si (KR); Gunhyo Lee, Asan-si (KR); Yongjin Lee, Asan-si (KR); Woo-Seok Jeon, Yongin (KR)

(73) Assignees: SAMSUNG CORNING PRECISION MATERIALS CO., LTD., Gumi-si, Gyeongsangbuk-do (KR); SAMSUNG DISPLAY CO., LTD., Yongin, Gyeonggi-do (KR); SAMSUNG CORNING ADVANCED GLASS, LLC, Asan-si, Chungcheongnam-do (KR)

( * ) Notice: Subject to any disclaimer, the term of this patent is extended or adjusted under 35 U.S.C. 154(b) by 0 days.

(21) Appl. No.: 13/931,697

(22) Filed: Jun. 28, 2013

(65) Prior Publication Data

US 2014/0001469 A1 Jan. 2, 2014

(30) Foreign Application Priority Data

Jun. 29, 2012 (KR) .................. 10-2012-0070390

(51) Int. Cl.
| | |
|---|---|
| H01L 29/10 | (2006.01) |
| H01L 29/12 | (2006.01) |
| H01L 29/786 | (2006.01) |
| C23C 14/34 | (2006.01) |
| C23C 14/08 | (2006.01) |
| C23C 14/00 | (2006.01) |

(52) U.S. Cl.
CPC ...... *H01L 29/78693* (2013.01); *C23C 14/3407* (2013.01); *C23C 14/0036* (2013.01); *C23C 14/086* (2013.01); *C23C 14/3414* (2013.01)

(58) Field of Classification Search
None
See application file for complete search history.

(56) References Cited

U.S. PATENT DOCUMENTS

2010/0304528 A1* 12/2010 Kim et al. .................. 438/104

OTHER PUBLICATIONS

KR1020100130098.*

* cited by examiner

Primary Examiner — Sonya D McCall Shepard
(74) Attorney, Agent, or Firm — McDermott Will & Emery LLP

(57) ABSTRACT

A thin-film transistor includes a metal electrode and a zinc oxide-based barrier film that blocks a material from diffusing out of the metal electrode. The zinc oxide-based barrier film is made of zinc oxide doped with indium oxide, the content of the indium oxide ranging, by weight, 1 to 50 percent of the zinc oxide-based barrier film. A zinc oxide-based sputtering target for deposition of a barrier film of a thin-film transistor is made of zinc oxide doped with indium oxide, the content of the indium oxide ranging, by weight, 1 to 50 percent of the zinc oxide-based sputtering target.

10 Claims, 3 Drawing Sheets

In          Zn

Etched          Not Etched

THIN-FILM TRANSISTOR AND ZINC OXIDE-BASED SPUTTERING TARGET FOR THE SAME

CROSS REFERENCE TO RELATED APPLICATION

The present application claims priority from Korean Patent Application Number 10-2012-0070390 filed on Jun. 29, 2012, the entire contents of which application are incorporated herein for all purposes by this reference.

BACKGROUND OF THE INVENTION

1. Field of the Invention

The present invention relates to a thin-film transistor (TFT) and a zinc oxide-based sputtering target for the same, and more particularly, to a barrier film of a TFT and an indium oxide-doped zinc oxide-based sputtering target that is used for deposition of the barrier film.

2. Description of Related Art

A liquid crystal display (LCD) or an electroluminescent display (EL) has superior displaying performance and consumes little power. Therefore, the LCD or EL is widely used for display devices of mobile phones, personal computers (PCs), word processors, TVs or the like. These displays operate using transistors, namely, thin-film transistors (TFTs) which are formed of fine patterns. As for formation of TFTs, a thin film layer which has semiconductor characteristics is required to be formed between electrodes.

Such a semiconductor layer is made of amorphous silicon (Si) or polycrystalline Si, both of which have advantages and disadvantages. For instance, amorphous Si is advantageous in that it can be easily deposited on a large area and its manufacturing cost is inexpensive. However, amorphous Si has low mobility, i.e. the ability of amorphous Si to allow electrons to migrate through the semiconductor layer is low. Therefore, it is difficult to apply amorphous Si to high-definition displays, which is problematic. In contrast, the mobility of polycrystalline Si is at least 100 times the mobility of amorphous Si, which is advantageous for realizing the image quality of an organic light-emitting diode (OLED) or LCD in the level of ultrahigh definition. However, it is difficult to deposit polycrystalline Si on a large area, which is a disadvantage against its application to a large TV. In addition, the manufacturing cost of polycrystalline Si is high, which lowers the price competitiveness of a product.

In order to overcome these problems, many attempts have been made by a number of research groups in order to substitute the semiconductor layer with an amorphous oxide. Oxide semiconductor can be easily deposited on a large area by sputtering that is a common method of forming a film of a transparent electrode. In addition, oxide semiconductor has high mobility that is 10 to 50 times the mobility of amorphous silicon. Therefore, attempts to apply an oxide semiconductor to mobile devices that require low power consumption are actively underway. In addition, research intended to spread the application of this technology to TVs is also underway.

As a sputtering target used for depositing an oxide semiconductor layer, a sputtering target that is generally composed of four elements of In, Ga, Zn and O is well known. Here, it is known that the ratio of these elements In:Ga:Zn is 1:1:1 or 2:2:1. In a TFT device, when the oxide semiconductor layer is deposited by sputtering, source and drain electrodes are generally deposited on top of the oxide semiconductor layer. Since these electrodes do not have adequate electric contact with an oxide that has a higher resistance and the danger of diffusing into the oxide semiconductor layer, a barrier film made of Ti or a material such as Cu—Mn is interposed between the oxide semiconductor layer and the electrodes.

Recently, the application of a copper electrode that can exhibit a high level of performance is being examined as an electrode material, and the problem in that Cu and Ti diffuses into the oxide semiconductor layer is becoming an issue. Therefore, a barrier material that improves the contact between a Cu electrode and the oxide semiconductor layer, prevents Cu from diffusing into the oxide semiconductor layer, has superior etching selectivity in relation to the oxide semiconductor layer, and does not create problems such as an undercut, due to etching, is gaining more interest.

The information disclosed in the Background of the Invention section is provided only for better understanding of the background of the invention, and should not be taken as an acknowledgment or any form of suggestion that this information forms a prior art that would already be known to a person skilled in the art.

BRIEF SUMMARY OF THE INVENTION

Various aspects of the present invention provide a composition of a sputtering target with which a crystalline barrier film can be realized, in which the crystalline barrier film has superior contact ability and restricts a variety of metal electrodes from reacting with an oxide semiconductor layer which can achieve ultrahigh definition and low power consumption characteristics and is currently applied to a thin film transistor. Also provided is a composition of a sputtering target with which a crystalline barrier film can be realized, in which the crystalline barrier film has superior etching selectivity in existing etching conditions and allows an etching rate to be easily controlled so that no undercut is created.

Also provided is a zinc oxide-based target doped with indium oxide with which a thin film having a crystalline ZnO structure can be realized, unlike the composition of an indium oxide-based target doped with zinc oxide which is being used in the manufacture of an amorphous thin film which is typically used for a pixel transparent electrode.

The sputtering target having a composition according to the present invention is characterized in that it allows superior characteristics such as etchability and contact ability to appear in a thin-film transistor (TFT) structure to which the above-mentioned oxide semiconductor layer is applied. However, this is not intended to be limiting, but application fields of the sputtering target can be expanded by adjusting the content ratio of a portion of the TFT structure that adjoins the metal electrode depending on the use.

In an aspect of the present invention, provided is a thin-film transistor that includes a metal electrode and a zinc oxide-based barrier film that blocks a material from diffusing out of the metal electrode. The zinc oxide-based barrier film is made of zinc oxide doped with indium oxide, the content of the indium oxide ranging, by weight, 1 to 50 percent of the zinc oxide-based barrier film.

In another aspect of the present invention, provided is a zinc oxide-based sputtering target for deposition of a barrier film of a thin-film transistor. The zinc oxide-based sputtering target is made of zinc oxide doped with indium oxide, the content of the indium oxide ranging, by weight, 1 to 50 percent of the zinc oxide-based sputtering target.

As described above, the barrier film according to the invention can be used as the basic material that forms a thin film which does not create a problem due to the corrosion of an underlying oxide semiconductor layer or the like. This is because, when a Si semiconductor layer, namely an existing channel layer, of a TFT is substituted with an oxide semiconductor layer, the barrier film prevents the metal electrode from diffusing into the oxide semiconductor layer, and as for etching characteristics, allows an etching rate to be adjusted with superior etching selectivity in relation to the oxide semiconductor layer.

In addition, the barrier layer according to the invention can contribute to simplification of the manufacturing process since it can be summarily etched together with the metal electrode. In the related art, since the metal electrode must be etched separately from the barrier film, the manufacturing process is inefficient.

Furthermore, the barrier film according to the invention has the function of improving contact with a nonconductive oxide layer and a metal layer in addition to its characteristic of serving as a barrier. Therefore, the barrier film can be used in any portion that is to form an Ohmic contact between metal and the oxide layer which form a TFT device.

In addition, the sputtering target according to the invention can be subjected to direct current (DC) sputtering and be manufactured at a high density.

The methods and apparatuses of the present invention have other features and advantages which will be apparent from, or are set forth in greater detail in the accompanying drawings, which are incorporated herein, and in the following Detailed Description of the Invention, which together serve to explain certain principles of the present invention.

DETAILED DESCRIPTION OF THE INVENTION

Figure 1:
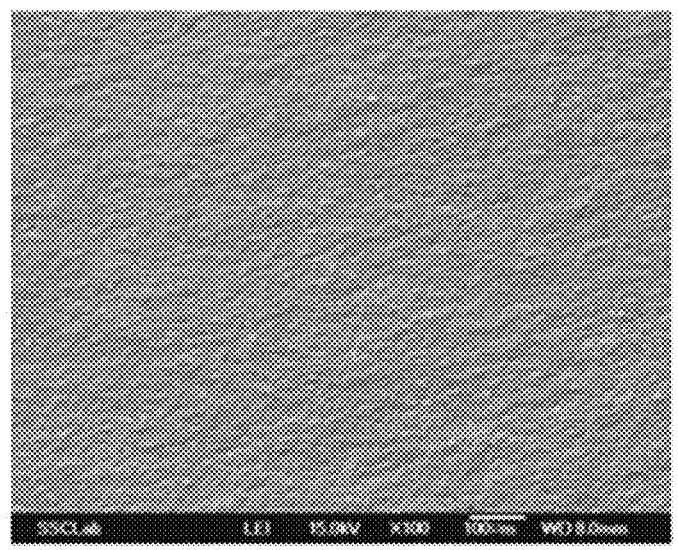
FIG. 1 is a scanning electron microscopy (SEM) picture showing the surface of a zinc indium oxide (ZIO) target according to an embodiment of the present invention which is sintered at 1450° C. in an air-oxygen atmosphere.

The present invention relates to a zinc oxide-based sputtering target doped with indium oxide that is used in the process of fabricating a thin-film transistor (TFT) which forms a component of a flat panel display to which an oxide semiconductor layer is applied. The zinc oxide-based sputtering target can form a crystalline thin film that prevents the metal used for gate, source and drain electrodes from diffusing into another thin film layer, and is applicable to a display due to its high transmittance. In addition, the rate at which the zinc oxide-based sputtering target is etched by a chemical can be controlled depending on the composition of the sputtering target.

The application of the present invention is not limited to a specific part of the TFT to which the above-mentioned oxide semiconductor is applied, but realizes a product that can be applied for variety of uses to parts that closely adjoin an electrode in the TFT which includes the gate, source and drain electrodes.

Preferably, the zinc oxide-based sputtering target according to the present invention has a composition that includes zinc oxide added with indium oxide, the content of indium oxide preferably ranging, by weight, from 1 to 50 percent of zinc oxide, and is sintered at a temperature ranging from 1200 to 1500° C. It is more preferable that the content of indium oxide ranges, by weight, from 20 to 40 percent of the content of zinc oxide. The zinc oxide-based sputtering target can be additionally doped with at least one selected from among group III elements, such as Ga and Al, and group IV elements, such as Zr, Si and Sn. In addition, the resistivity of the zinc oxide-based sputtering target doped with indium oxide according to the present invention is preferably 100 $\Omega \cdot cm$ or less, such that deposition can be carried out by reliable direct current (DC) sputtering. The sputtering target according to the present invention can be used at a power density ranging from 0.1 to 8 $W/cm^2$ during the DC sputtering. In addition, there are no indium oxide aggregates having a size of 1 μm or greater since indium oxide is uniformly dispersed in zinc oxide. Thus, the local resistance uniformity of the sinter can be 10% or less. In addition, since the composition uniformity of a thin film does not exceed ±10% when conducting sputtering deposition using the sinter according to the present invention, it is possible to realize uniform characteristics when fabricating TFT devices. Since the sputtering target according to the present invention preferably has a high density of 5.6 $g/cm^3$ or greater, DC sputtering to which high power density is applied does not have any problem such as abnormal discharge. In addition, since the sputtering target according to the present invention has less blackening, which is typical of sputtering targets, little defects are caused by particles in the sputtering deposition process.

A barrier film according to the present invention has a composition that includes zinc oxide added with indium oxide, the content of indium oxide preferably ranging, by weight, from 1 to 50 percent of zinc oxide. It is more preferable that content of indium oxide ranges, by weight, from 20 to 40 percent of zinc oxide. The zinc oxide-based barrier film can be additionally doped with at least one selected from among group III elements, such as Ga and Al, and group IV elements, such as Zr, Si and Sn. In addition, the resistivity of the zinc oxide-based barrier film that is deposited using the sputtering target according to the present invention is preferably 100 $\Omega \cdot cm$ or less, such that an Ohmic contact can be made between a metal electrode layer which will be deposited thereon and an underlying thin film, thereby preventing an electrical short circuit inside the TFT device. In addition, the zinc oxide-based barrier film can act as a barrier between the metal electrode and an upper/lower thin film in order to prevent the metal electrode from diffusing into the thin film. In addition, the thin film that is deposited using the sputtering target according to the present invention is not subject to undercut in which the thin film is eroded inward without being linearly etched by an etching solution. Preferably, the zinc oxide-based barrier film has a crystal size ranging from 10 to 5000 Å at a full width at half maximum (FWHM) analysis of an X-ray diffraction (XRD) measurement.

Many studies have been made on a zinc oxide-based targets doped with indium oxide which can used for realizing an amorphous thin film for a transparent electrode of a TFT pixel having improved etchability. However, according to this composition, the sinter has a Bixbyite structure of zinc oxide rather than a Wurzite structure of zinc oxide. In addition, an indium oxide-based amorphous thin film doped with zinc oxide is formed. This thin film has an advantage in that the etching speed thereof is faster than that of an indium tin oxide (ITO) thin film of the related art when the TFT pixel electrode is patterned by etching.

In contrast, the target according to the present invention requires that zinc oxide be doped with indium oxide, the content of indium oxide ranging, by weight, from 1 to 50 percent of zinc oxide. The barrier film that is deposited using the target according to the present invention is characterized in that zinc oxide grows in the 002 crystal direction in the crystal structure. In addition, when the barrier film according to the present invention is realized, in the above-mentioned TFT structure, it is possible to satisfy the required etching characteristics while preventing the electrode from diffusing.

The manufacturing conditions of the zinc oxide-based target must be highly controlled and optimized in order for the resistivity of the zinc oxide-based target doped with indium oxide to be 100 Ω·cm or less as in the above-mentioned composition, and at the same time, for indium oxide to be uniformly dispersed in zinc oxide with no indium oxide aggregates having a size of 1 μm or greater and for the sintering density to be 5.6 g/cm$^3$ or greater.

When the barrier film is deposited using the composition of the target according to the present invention, it is required that the resistivity of the barrier film range 100 to $1\times10^{-4}$ Ω·cm at a thin film thickness ranging from 30 to 50 nm. It is possible to use argon gas and oxygen by mixing them at a suitable ratio during sputtering in order to realize the characteristics of the above-mentioned barrier film. The electrical contact ability between the metal electrode and the oxide semiconductor layer may deteriorate significantly beyond this range, thereby causing a problem in the TFT device.

In addition, the barrier film can be heat treated at a temperature ranging from 200 to 400° C. for 10 to 120 minutes.

A target that exhibits the above-described characteristics requires that it can be subjected to DC sputtering and a highly reliable discharge can be made under the condition in which application power density ranges from 0.1 to 8 W/cm$^2$. These characteristics closely relate to the resistance of the target.

The barrier film that is formed according to the present invention is required to have superior etching linearity without an undercut. A zinc oxide-based target that has a composition beyond the range of the present invention or is added with a different substance cannot realize the preferable resistivity or etching characteristics of the barrier film.

In order to realize the above-described characteristics, conditions in the manufacture of the target must be tightly controlled as follows.

First, the doping content of indium oxide ranges, by weight, from 1 to 50 percent in order to control the etching characteristics. While the doping content of indium oxide may vary depending on the type or use of an etching solution that is used in the TFT process, it becomes difficult to control the etching characteristics or difficult to realize a crystalline thin film including the unique structure of zinc oxide beyond the above-mentioned content range.

The second condition is to control the diameter of dispersed particles at the stage of preparing a slurry in the process of manufacturing a target.

A method of manufacturing a target according to the present invention includes the process of preparing the slurry mixture in a stepwise fashion.

First, zinc oxide is mixed with a mixed solution in which distilled water and a dispersing agent and wet milling is carried out such that the average diameter of the dispersed particles ranges from 0.1 to 0.8 μm. The content of the dispersing agent that is added may range, by weight, from 0.1 to 2 percent, and vary depending on the diameter of particles that are to be dispersed. In addition, the dispersing agent must have a structure that can be easily adsorbed to the surface of indium oxide and zinc oxide in a suspension. For this purpose, an organic acid, such as citric acid, or a polycarboxylic acid can be used. The dispersing agent is required to maintain the pH of the suspension in order to realize the high dispersion characteristics of particles. For this, a dispersing agent in the form of polycarboxylic acid salt can be used.

When the dispersion of zinc oxide has been complete, the dispersing agent is added into the suspension in which zinc oxide is dispersed. The content of the dispersing agent ranges, by weight, from 0.3 to 2.5 percent of indium oxide. Afterwards, indium oxide is added to the resultant mixture. After that, the particle size of the slurry in which indium oxide and zinc oxide are mixed is adjusted to be in the range from 0.1 to 0.5 μm by wet milling.

The wet milling is carried out in the stepwise fashion for the following reasons. Since the two types of dried raw powder have different average diameters and different levels of hardness and cohesion, it is impossible to set each raw material powder to an intended particle diameter when the two types of dried raw powder are mixed and are summarily subjected to wet milling. Then, during manufacturing of the sinter, indium oxide does not uniformly diffuse across a zinc oxide matrix and localized clustering occurs, thereby deteriorating the electrical characteristics and mechanical properties of the target. Therefore, in order to overcome this problem, the process of uniformly dispersing particles is carried out in the stepwise fashion according to the particle diameter that is to be controlled. In addition, adjustment of the dispersing particle diameter is closely related to a sintering temperature. When the optimum condition is not obtained, zinc oxide may abnormally volatilize during hot sintering.

When the wet milling is finished, a binder is added to the slurry mixture. The binder is added in order to maintain the strength of a compact in the process of shaping the slurry after drying the slurry into powder. The binder can be implemented as polyvinyl alcohol, poly ethylene glycol or the like, and be added at an amount ranging, by weight, from 0.01 to 5 percent, and preferably, from 0.5 to 3 percent of the powder in the slurry. It can be understood that the optimization of the amount and composition of the added binder has a significant effect on the sintering density of the sinter while it has a slight effect on the electrical characteristics of the thin film. If the composition of the added binder is not optimized, the shaping density decreases in the process of shaping granular powder, leading to a decrease in the sintering density. The decreased sintering density means that pores which cause local high resistances are formed inside the sinter. This also acts as an obstacle against manufacturing of a target that can be subjected to DC sputtering.

The slurry mixture that is manufactured as above is dried by a spray drying method, thereby producing granular powder. The granular power is then made into a compact using a cold press (a hydraulic press) and by cold isostatic pressing. Afterwards, the compact can be sintered at a temperature ranging from 1400 to 1600° C., thereby manufacturing a zinc oxide-based sputtering target. The sintering temperature may be regarded as a key factor in the process of manufacturing the sinter. The sintering temperature proposed in the present invention refers to a temperature where the resistance of the target is controlled in the range from $1\times10^{-3}$ to 50Ω where DC sputtering can be used in the process of manufacturing a zinc oxide-based target doped with gallium oxide. The specific sintering process includes density growth and resistance reduction.

The resistivity of the sputtering target manufactured by the above-described process is 100 Ω·cm, in which a film can be reliably formed on a glass substrate by DC sputtering. The area density of DC power that is applicable to the target when forming the film can be controlled freely in the range from 0.1 to 8 W/cm². Although glow discharge is possible beyond this range, there are a high possibility that defects such as abnormal discharge may occur and a very high possibility that cracks may be formed in the target. Therefore, it can be understood that the sputtering target beyond this range is not applicable to the industry. The resistivity of the thin film that can be obtained when deposition is carried out by DC sputtering using this target can range from 100 to $1\times10^{-4}$ Ω·cm depending on the composition at the 30 nm thickness. During deposition, the basic degree of vacuum of the chamber must be controlled in the range from $1\times10^{-7}$ to $1\times10^{-5}$ torrs. Although a higher-quality thin film can be produced as the initial degree of vacuum is higher, maintaining ultra-high vacuum in industrial facilities increases a cost. Therefore, when the degree of vacuum is maintained at the above-mentioned level, a high-quality thin film can be produced using the target according to the present invention. A reactive gas such as oxygen can be fed together with Ar gas in order to control the crystallinity and resistance of the thin film during deposition. After deposition, the thin film can be heat-treated at a temperature ranging from 200 to 400° C.

In the thin film that is deposited or heat-treated as described above using the target according to the invention, during TFT processing, no portions between the metal electrode and the lower/upper film are undercut when etched by a chemical that is used for etching the metal electrodes. Here, when the etching speed is too slow, mass productivity is lowered. When the etching speed is too fast, it is difficult to control the process. Therefore, when the film is etched after being formed with the composition according to the invention, etching can be controlled at a suitable speed and no nonuniform undercut is formed by the etching solution.

In addition, when a channel layer, such as an oxide semiconductor layer, or another oxide layer is present on the undersurface or upper surface of this thin film, the layer can act as a barrier layer that prevents the metal electrodes from diffusing into other layers during deposition of the metal electrodes or during heat treatment of the metal electrodes after deposition. In addition, since an Ohmic contact with the upper/lower layer is obtained, an electrical short-circuit is not created. This can be examined by a device characteristics analysis after the fabrication of the TFT. It is also possible to examine that the metal electrode does not diffuse into the upper/lower thin film using various types of analysis equipment.

EXAMPLE

In order to manufacture zinc oxide-based sputtering targets, zinc oxide having an average particle diameter of about 0.5 μm was added to distilled water to which a dispersing agent was added at a content of 1.0 weight percent of the zinc oxide, such that the zinc oxide had respective contents of 65, 70 and 75 percent of the total weight of the sputtering target. Afterwards, the resultant mixtures were ground/dispersed by wet milling such that the average diameter of the dispersed particles became 0.2 μm. After that, indium oxide having an average particle diameter of 1 μm and a dispersing agent having a content of 0.5 weight percent of the indium oxide were added, and the resultant mixtures were wet-milled such that the final diameter of the dispersed particles became 0.5 μm. The dispersing agent that was used here is polyacrylic acid amine salt.

After the final zinc oxide-based slurry mixtures were produced, 1.0 weigh percent of polyvinyl acetate (PVA) and 0.5 weight percent of polyethylene glycol (PEG) were added as a binder. Milling was carried out once more, thereby producing uniform slurries.

In order to make the zinc oxide-based slurries into granular powder, a spray drying method was used. In order to manufacture the granular powder by the spray drying method and produce zinc oxide-based sinters, axial pressing was performed, followed by cold isostatic pressing.

Resultant compacts were sintered at 1450° C. for 20 hours in a mixed atmosphere of air/oxygen. When the sintering was completed, values of the resistivity of the sinters were 4.7, 7.3, $8.0\times10^{-3}$ Ω·cm, and densities were 5.72, 5.81 and 5.91 g/cm³.

Figure 2:
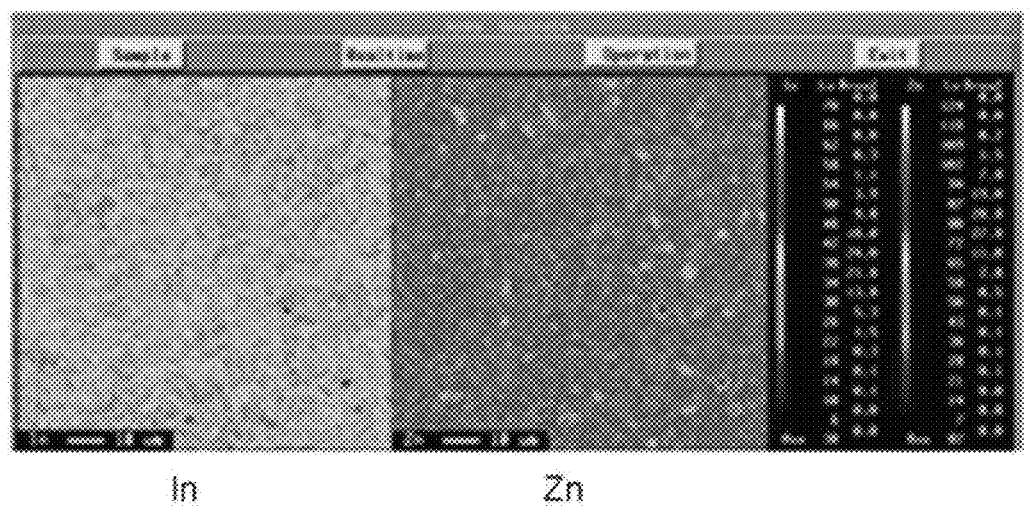
FIG. 2 is an electron probe micro-analyzer (EPMA) image showing the surface of the ZIO target shown in FIG. 1 which is doped with 30 wt % of indium oxide.

Pores in the resultant sinters were observed by scanning electron microscopy (SEM), indium oxide aggregates distributed inside zinc oxide were observed by an electron probe micro-analyzer (EPMA) analysis, and the results are presented in FIG. 1 and FIG. 2. It can be appreciated from FIG. 1 that the sinter had a high density and substantially no pores were formed inside the sinter. As shown in FIG. 2, it can be appreciated that all of indium oxide particles distributed inside the zinc oxide matrix are uniformly dispersed with a size of 1 μm or less.

Each of the sinters manufactured by the foregoing process was bonded to a backing plate made of Cu, and sputtering was carried out using the resultant structure. According to the sputtering conditions, the base pressure of the chamber was $1\times10^{-6}$ torr, and the working pressure was 0.5 Pa. Deposition was carried outer by causing plasma discharge at 100° C. in a pure Ar atmosphere. Here, the target size was 565 mm×690 mm, and induced power was DC 10 kW. A resultant thin film was deposited at a thickness of 30 nm on a substrate. The substrate that was used here is a non-alkaline glass with an indium gallium zinc oxide (IGZO) layer formed thereon in advance.

Figure 3:
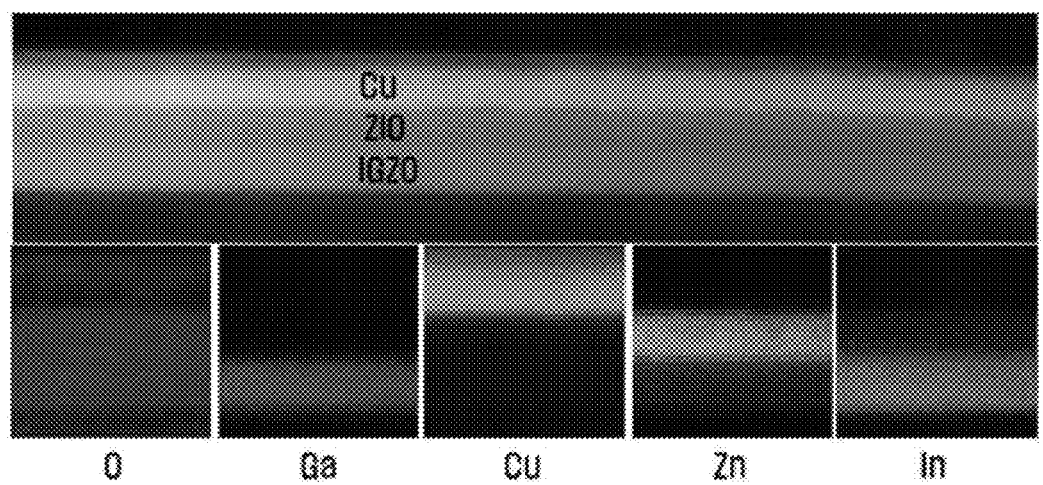
FIG. 3 is a view showing a Cu barrier performance analysis result of a ZIO thin film according to an embodiment of the present invention.

Cu, or an electrode material, was deposited on a zinc indium oxide (ZIO) thin film which was deposited at the 30 nm thickness on the IGZO layer. Afterwards, transmission electron microscopy (TEM) and secondary ion mass spectrometer (SIMS) analyses were conducted on whether or not Cu, or the electrode material, diffuses into the IGZO layer. FIG. 3 shows a TEM image of IGZO, ZIO and Cu deposits on a glass substrate. In FIG. 3, an SIMS analysis shows that Cu did not diffuse into the IGZO layer.

Figure 4:
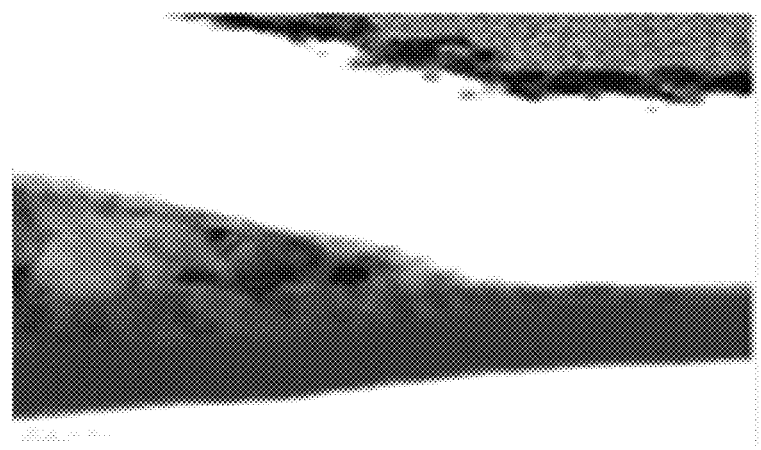
FIG. 4 is a view showing the analysis results regarding the occurrence of an undercut in the ZIO thin film shown in FIG. 3.
Figure 5:
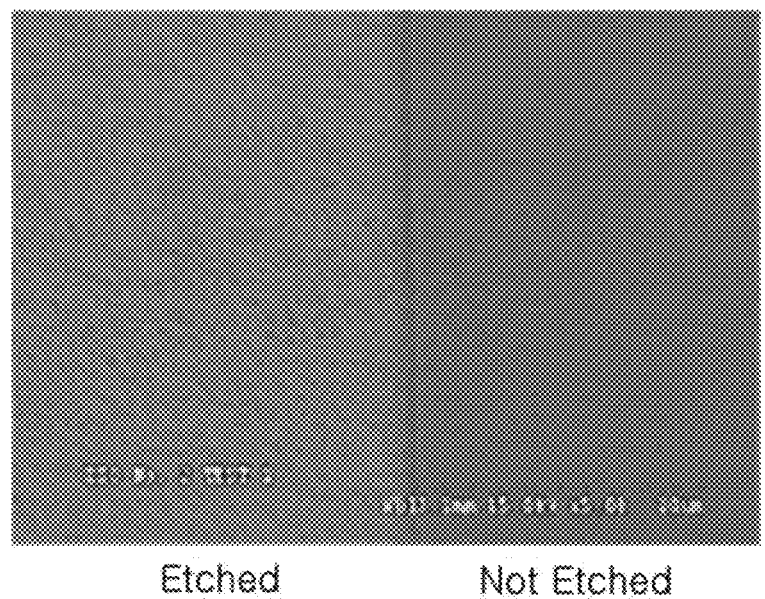
FIG. 5 is a view showing a surface image of an etched unit ZIO thin film according to an embodiment of the present invention.
Figure 6:
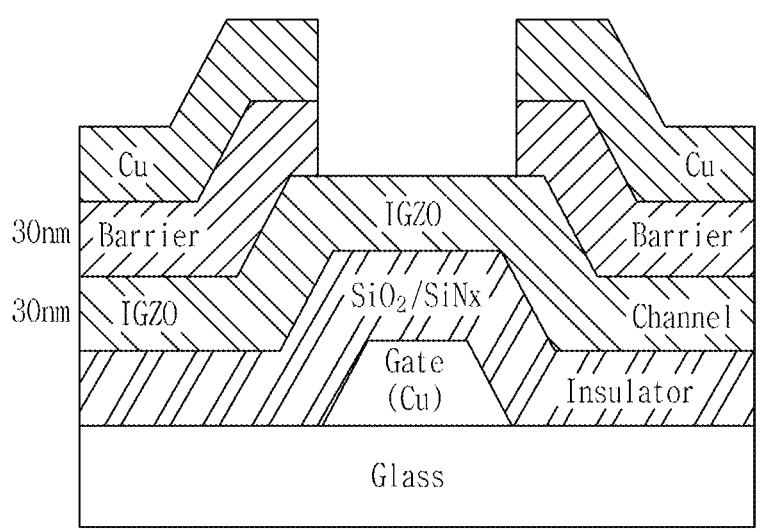
FIG. 6 is a cross-sectional view showing the structure of a thin-film transistor (TFT) according to an embodiment of the present invention.

In addition, as shown in FIG. 4 and FIG. 5, the etching profile indicates that the ZIO thin film has superior etching linearity.

The foregoing descriptions of specific exemplary embodiments of the present invention have been presented with respect to the drawings. They are not intended to be exhaustive or to limit the present invention to the precise forms disclosed, and obviously many modifications and variations are possible for a person having ordinary skill in the art in light of the above teachings.

It is intended therefore that the scope of the present invention not be limited to the foregoing embodiments, but be defined by the Claims appended hereto and their equivalents.

What is claimed is:

1. A thin-film transistor comprising: a metal electrode;
   a zinc oxide-based barrier film comprising zinc oxide doped with indium oxide, and a content of the indium oxide ranges, by weight, from 1 to 50 percent of the zinc oxide-based barrier film; and an oxide semiconductor layer, wherein the zinc oxide-based barrier film is disposed between the metal electrode and the oxide semiconductor layer and the barrier film blocks a material from diffusing out of the metal electrode and into the oxide semiconductor layer.

2. The thin-film transistor of claim 1, wherein the metal electrode comprises at least one of a source electrode and a drain electrode.

3. The thin-film transistor of claim 1, wherein the metal electrode comprises copper.

4. The thin-film transistor of claim 1, wherein the oxide semiconductor layer comprises indium-gallium-zinc oxide (IGZO).

5. The thin-film transistor of claim 1, wherein the zinc oxide-based barrier film further comprises a dopant of at least one element selected from among group III elements and group IV elements.

6. The thin-film transistor of claim 1, wherein a resistivity of the zinc oxide-based barrier film ranges from 100 to $10^{-4}$ Ω·cm.

7. The thin-film transistor of claim 1. wherein the zinc oxide-based barrier film has a crystal size ranging from 10 to 5000 Å in a full width at half maximum (FWHM) analysis of an X-ray diffraction (XRD) measurement.

8. The thin-film transistor of claim 1, comprising a thin-film transistor for a liquid crystal display or an organic light-emitting device.

9. A zinc oxide-based sputtering target for deposition of a barrier film of a thin-film transistor, the zinc oxide-based sputtering target comprising zinc oxide doped with indium oxide, a content of the indium oxide ranging, by weight, from 1 to 50 percent of the zinc oxide-based sputtering target, wherein a resistivity of the zinc oxide-based sputtering target is 100 Ω·cm or less.

10. The zinc oxide-based sputtering target of claim 9, further comprising at least one element selected from among group III elements and group IV elements.

* * * * *

UNITED STATES PATENT AND TRADEMARK OFFICE
CERTIFICATE OF CORRECTION

PATENT NO. : 9,035,297 B2  
APPLICATION NO. : 13/931697  
DATED : May 19, 2015  
INVENTOR(S) : Park et al.

Page 1 of 1

It is certified that error appears in the above-identified patent and that said Letters Patent is hereby corrected as shown below:

On the title page

Item (73)

delete

"SAMSUNG DISPLAY CO., LTD., Yongin-City, REPUBLIC OF KOREA;
SAMSUNG CORNING PRECISION MATERIALS CO., LTD., Gumi-si, REPUBLIC OF KOREA"

should read

--SAMSUNG DISPLAY CO., LTD., Yongin-City, Gyeonggi-do, REPUBLIC OF KOREA;
SAMSUNG CORNING ADVANCED GLASS, LLC, Asan-si, Chungcheongnam-do, REPUBLIC OF KOREA--

Signed and Sealed this
Eighteenth Day of August, 2015

Michelle K. Lee
*Director of the United States Patent and Trademark Office*